US010651623B2

(12) United States Patent
Auen et al.

(10) Patent No.: US 10,651,623 B2
(45) Date of Patent: May 12, 2020

(54) OPTOELECTRONIC ARRANGEMENT

(71) Applicant: OSRAM OLED GmbH, Regensburg (DE)

(72) Inventors: Karsten Auen, Regensburg (DE); Markus Horn, Straubing (DE); Roland Enzmann, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/768,049

(22) PCT Filed: Oct. 14, 2016

(86) PCT No.: PCT/EP2016/074772
§ 371 (c)(1),
(2) Date: Apr. 13, 2018

(87) PCT Pub. No.: WO2017/064283
PCT Pub. Date: Apr. 20, 2017

(65) Prior Publication Data
US 2018/0309263 A1 Oct. 25, 2018

(30) Foreign Application Priority Data
Oct. 15, 2015 (DE) .......................... 10 2015 117 539

(51) Int. Cl.
*H01S 5/00* (2006.01)
*H01S 5/022* (2006.01)
*H01S 5/40* (2006.01)
*H01L 33/48* (2010.01)
(Continued)

(52) U.S. Cl.
CPC ............ *H01S 5/005* (2013.01); *H01L 33/483* (2013.01); *H01L 33/486* (2013.01);
(Continued)

(58) Field of Classification Search
CPC .. H01S 5/005; H01S 5/4025; H01S 2933/005; H01S 5/02288; H01S 5/02292;
(Continued)

(56) References Cited

U.S. PATENT DOCUMENTS 6,944,194 B1 * 9/2005 Hatori ..................... H01S 5/141
372/21
2008/0165539 A1 * 7/2008 Hsu ......................... H01L 33/60
362/309
(Continued)

FOREIGN PATENT DOCUMENTS

DE 10 2008 012 316 A1 4/2009
DE 10 2010 062 463 A1 6/2012
(Continued)

*Primary Examiner* — Xinning(Tom) Niu
(74) *Attorney, Agent, or Firm* — DLA Piper LLP (US)

(57) ABSTRACT

An arrangement includes a conversion element, an optoelectronic semiconductor component and a first carrier including a carrier plane, wherein the conversion element is arranged on the carrier plane, the optoelectronic semiconductor component emits a first electromagnetic radiation including a first beam direction and a first wavelength from a first spectral range during operation, the first electromagnetic radiation is directed onto the conversion element, the conversion element at least partly converts the first electromagnetic radiation into a second electromagnetic radiation including a second wavelength from a second spectral range, the first beam direction of the optoelectronic semiconductor component is oriented at an inclination with respect to the carrier plane, a housing including a housing cap is provided, the housing cap is configured in a hollow-body-like fashion, the housing cap and the carrier define an interior, the conversion element and the semi-conductor component are arranged in the interior, and the housing cap includes a coupling-out window that couples out the second electromagnetic radiation.

20 Claims, 7 Drawing Sheets

(51) Int. Cl.
*H01L 33/50* (2010.01)
*H01L 33/62* (2010.01)
*H01L 33/54* (2010.01)

(52) U.S. Cl.
CPC .......... *H01L 33/505* (2013.01); *H01L 33/507* (2013.01); *H01L 33/62* (2013.01); *H01S 5/02212* (2013.01); *H01S 5/02288* (2013.01); *H01S 5/02292* (2013.01); *H01S 5/4025* (2013.01); *H01L 33/54* (2013.01); *H01L 2933/005* (2013.01); *H01L 2933/0033* (2013.01)

(58) Field of Classification Search
CPC ............... H01S 5/02212; H01L 33/486; H01L 2933/0033; H01L 33/54; H01L 33/507; H01L 33/62; H01L 33/505; H01L 33/483; H01L 2933/005
See application file for complete search history.

(56) References Cited

U.S. PATENT DOCUMENTS

| 2010/0172388 | A1 | 7/2010 | Hwang et al. |
| 2011/0006334 | A1* | 1/2011 | Ishii ..................... C09K 11/584 257/98 |
| 2012/0001538 | A1* | 1/2012 | Kim .................... H01L 25/0753 313/512 |
| 2012/0033696 | A1* | 2/2012 | Hayashi ............. H01S 5/02204 372/43.01 |
| 2013/0027962 | A1 | 1/2013 | Takahashi et al. |

FOREIGN PATENT DOCUMENTS

| DE | 10 2012 005 660 A1 | 9/2013 |
| DE | 10 2012 109 131 A1 | 3/2014 |
| WO | 2009/039827 A1 | 4/2009 |

\* cited by examiner

OPTOELECTRONIC ARRANGEMENT

TECHNICAL FIELD

This disclosure relates to an optoelectronic arrangement.

BACKGROUND

An arrangement comprising a laser chip, a conversion element, a lens and a housing is known. The laser chip is arranged in the housing. The conversion element is arranged outside the housing. The laser chip provides blue laser light during operation, the light being coupled out from the housing via a coupling-out window. The laser light is collected via the lens and directed onto the conversion element. The conversion element generates visible light comprising a different color than the laser light.

There is nonetheless a need to provide an improved arrangement.

SUMMARY

We provide an arrangement including a conversion element, an optoelectronic semiconductor component and a first carrier including a carrier plane, wherein the conversion element is arranged on the carrier plane, the optoelectronic semiconductor component emits a first electromagnetic radiation including a first beam direction and a first wavelength from a first spectral range during operation, the first electromagnetic radiation is directed onto the conversion element, the conversion element at least partly converts the first electromagnetic radiation into a second electromagnetic radiation including a second wavelength from a second spectral range, the first beam direction of the optoelectronic semiconductor component is oriented at an inclination with respect to the carrier plane, a housing including a housing cap is provided, the housing cap is configured in a hollow-body-like fashion, the housing cap and the carrier define an interior, the conversion element and the semiconductor component are arranged in the interior, and the housing cap includes a coupling-out window that couples out the second electromagnetic radiation.

We also provide an arrangement including a conversion element, an optoelectronic semiconductor component and a first carrier including a carrier plane, wherein the conversion element is arranged on the carrier plane, the optoelectronic semiconductor component emits a first electromagnetic radiation including a first beam direction and a first wavelength from a first spectral range during operation, the first electromagnetic radiation is directed onto the conversion element, the conversion element at least partly converts the first electromagnetic radiation into a second electromagnetic radiation including a second wavelength from a second spectral range, the first beam direction of the optoelectronic semiconductor component is oriented at an inclination with respect to the carrier plane, a housing including a housing cap is provided, the housing cap is configured in a hollow-body-like fashion, the housing cap and the carrier delimit an interior, the conversion element and the semiconductor component are arranged in the interior, the housing cap includes a coupling-out window that couples out the second electromagnetic radiation, the first carrier includes a first carrier top side, a second carrier including a second carrier top side and a carrier underside is provided, the second carrier connects by the carrier underside to the first carrier top side, the optoelectronic semiconductor component is arranged on the second carrier top side, the second carrier top side is arranged at an inclination with respect to the carrier plane, the optoelectronic semiconductor component includes an emission face and a longitudinal side, the optoelectronic semiconductor component is arranged by the longitudinal side on the second carrier top side, the emission face is a side face of the optoelectronic semiconductor component adjoining the longitudinal side, the emission face faces the conversion element, via the emission face, the optoelectronic semiconductor component emits substantially a large portion of the first electromagnetic radiation, and the first electromagnetic radiation is emitted in direction of the first carrier.

List of Reference Signs

| | |
|---|---|
| 10 | Arrangement |
| 15 | Electrical terminal |
| 20 | Housing |
| 25 | Optoelectronic semiconductor component |
| 30 | Conversion element |
| 35 | First carrier |
| 40 | Second carrier |
| 45 | Housing cap |
| 46 | Cap edge |
| 50 | Interior |
| 55 | Electrical conductor |
| 60 | Emission face |
| 65 | Recess |
| 70 | Base |
| 75 | Recess face |
| 80 | Carrier plane |
| 85 | First carrier top side of the first carrier |
| 90 | Carrier underside |
| 95 | Carrier side face of the second carrier |
| 100 | Second carrier top side of the second carrier |
| 105 | Longitudinal side |
| 109 | Further carrier |
| 110 | Coupling-out window |
| 115 | Section |
| 120 | Window contour |
| 125 | Emission region |
| 130 | Surroundings |
| 135 | First electromagnetic radiation |
| 140 | Shaded region |
| 145 | Second electromagnetic radiation |
| 150 | Reflection layer |
| 151 | First part of the first electromagnetic radiation |
| 152 | First portion of the second electromagnetic radiation |
| 153 | Second portion of the second electromagnetic radiation |

-continued

List of Reference Signs

| | |
|---|---|
| 155 | Second part of the first electromagnetic radiation |
| 170 | First optical element |
| 175 | Second optical element |
| 180 | Lens |
| 185 | Beam |
| 190 | Interior face |
| 200 | Further optoelectronic semiconductor component |
| 205 | Third carrier |
| 210 | Plane of symmetry |
| 215 | Center axis |
| 220 | Further carrier underside of the third carrier |
| 225 | Further side face of the third carrier |
| 230 | Third carrier top side of the third carrier |
| 231 | Additional further carrier |
| 235 | Longitudinal side of the further optoelectronic semiconductor component |
| 240 | Third electromagnetic radiation |
| 245 | Further emission face |
| $\alpha_1$ | First angle |
| $\alpha_2$ | Second angle |
| $\beta$ | Aperture angle |

DETAILED DESCRIPTION

Our arrangement comprises a conversion element, an optoelectronic semiconductor component and a first carrier comprising a carrier plane. The conversion element is arranged on the carrier plane. The optoelectronic semiconductor component is configured to emit a first electromagnetic radiation comprising a first beam direction and a first wavelength from a first spectral range during operation. The first electromagnetic radiation is directed onto the conversion element. The conversion element is configured at least partly to convert the first electromagnetic radiation into a second electromagnetic radiation comprising a second wavelength from a second spectral range. The first beam direction of the optoelectronic semiconductor component is oriented at an inclination with respect to the carrier plane.

This configuration has the advantage that the optoelectronic semiconductor component and the conversion element comprise a short heat path such that the optoelectronic semiconductor component and the conversion element may be cooled well and thermal overheating of the optoelectronic semiconductor component and the conversion element may be reliably avoided. Furthermore, the arrangement is compact such that the conversion element and the optoelectronic semiconductor component may be arranged jointly in a housing.

The conversion element may be configured to emit the second electromagnetic radiation with an emission direction, wherein the emission direction of the second electromagnetic radiation is delimited to an effective emission region by a means arranged in a manner offset with respect to the conversion element, wherein the optoelectronic semiconductor component is arranged outside the effective emission region.

The first carrier may comprise a first carrier top side, wherein a second carrier comprising a second carrier top side and a carrier underside is provided, wherein the second carrier connects by the carrier underside to the first carrier top side, wherein the optoelectronic semiconductor component is arranged on the second carrier top side, wherein the second carrier top side is arranged at an inclination with respect to the carrier plane. As a result, in particular, the heat path from the optoelectronic semiconductor component via the second carrier toward the first carrier is reduced.

The arrangement may comprise a reflection layer. The reflection layer is arranged between the first carrier and the conversion element. The reflection layer is configured to reflect the first and/or second electromagnetic radiation at least partly in a direction facing away from the first carrier. As a result, the efficiency of the arrangement may be further increased.

The first carrier may comprise a recess on a side facing the optoelectronic semiconductor component. The carrier plane is arranged at a base of the recess. The conversion element is at least partly arranged in the recess. As a result, during the operation of the arrangement, heat from the conversion element may be well dissipated into the first carrier.

The first carrier may comprise a first carrier top side, wherein a second carrier comprising a second carrier top side and a carrier underside is provided, wherein the second carrier connects by the carrier underside to the first carrier top side, wherein the optoelectronic semiconductor component is arranged on the second carrier top side, wherein the second carrier top side is arranged at an inclination with respect to the carrier plane, wherein the first carrier comprises a recess on a side facing the optoelectronic semiconductor component, wherein the carrier plane is arranged at a base of the recess, and wherein the conversion element is at least partly arranged in the recess.

The recess may comprise a base and a recess side face, wherein the recess is delimited by the base and the recess side face, wherein the recess side face adjoins the second carrier top side.

The optoelectronic semiconductor component may emit the first electromagnetic radiation via an emission face facing the conversion element. As a result, the optoelectronic semiconductor component may be configured in a flat fashion.

The first beam direction and the carrier plane may form an angle, wherein the angle comprises a value of 30° to 60°, in particular 40° to 50°. Additionally or alternatively, the value is 45°.

The optoelectronic semiconductor component may be arranged in a manner adjoining the conversion element. Alternatively, a first optical element is arranged between the first optoelectronic semiconductor component and the conversion element, wherein the first optical element is configured to focus the first electromagnetic radiation onto the conversion element.

The arrangement may comprise a housing comprising a housing cap. The housing cap is configured in a hollow-body-like fashion. The housing cap comprises a cap edge, wherein the cap edge connects to the first carrier, wherein the housing cap comprises a coupling-out window for coupling out the second electromagnetic radiation, the coupling-out window being arranged in a manner offset with respect to the cap edge.

The optoelectronic semiconductor component may be arranged between the coupling-out window and the first carrier.

The arrangement may comprise a second optical element. The second optical element connects to the housing cap. The second optical element is configured to alter a beam behavior of the second electromagnetic radiation, wherein the second optical element preferably comprises at least one lens. In this way, the arrangement may be adapted to its purpose of use in a simple manner.

The second optical element may be arranged between the coupling-out window and the conversion element, wherein the optoelectronic semiconductor component is arranged between the conversion element and the second optical element.

The arrangement may comprise a further optoelectronic semiconductor component. The further optoelectronic semiconductor component is configured to provide a third electromagnetic radiation comprising a third wavelength and a third beam direction. The third electromagnetic radiation is directed onto the conversion element. The conversion element is configured at least partly to convert the first and third electromagnetic radiation into the second electromagnetic radiation. The third beam direction is arranged at an inclination with respect to the carrier plane. In this way, it is possible in a simple manner to increase a power density of the arrangement by the further optoelectronic semiconductor component and at the same time to configure the arrangement in a compact fashion.

The emission direction of the second electromagnetic radiation may be guided between the optoelectronic semiconductor component and the further optoelectronic semiconductor component. As a result, a shading of the second radiation by the optoelectronic semiconductor component and/or the further optoelectronic semiconductor component is avoided.

The optoelectronic semiconductor component may comprise at least one laser chip and/or one LED chip.

A cap edge of the housing cap may directly contact the first carrier and connects to the first carrier.

The arrangement comprises a conversion element, an optoelectronic semiconductor component and a first carrier comprising a carrier plane, wherein the conversion element is arranged on the carrier plane, wherein the optoelectronic semiconductor component is configured to emit a first electromagnetic radiation comprising a first beam direction and a first wavelength from a first spectral range during operation, wherein the first electromagnetic radiation is directed onto the conversion element, wherein the conversion element is configured at least partly to convert the first electromagnetic radiation into a second electromagnetic radiation comprising a second wavelength from a second spectral range, wherein the first beam direction of the optoelectronic semiconductor component is oriented at an inclination with respect to the carrier plane, wherein a housing comprising a housing cap is provided, wherein the housing cap is configured in a hollow-body-like fashion, wherein the housing cap and the carrier delimit an interior, wherein the conversion element and the semiconductor component are arranged in the interior, and wherein the housing cap includes a coupling-out window for coupling out the second electromagnetic radiation, wherein the first carrier comprises a first carrier top side, wherein a second carrier comprising a second carrier top side and a carrier underside is provided, wherein the second carrier connects by the carrier underside to the first carrier top side, wherein the optoelectronic semiconductor component is arranged on the second carrier top side, wherein the second carrier top side is arranged at an inclination with respect to the carrier plane, wherein the optoelectronic semiconductor component comprises an emission face and a longitudinal side, wherein the optoelectronic semiconductor component is arranged by the longitudinal side on the second carrier top side, wherein the emission face is a side face of the optoelectronic semiconductor component that adjoins the longitudinal side, wherein the emission face faces the conversion element, wherein via the emission face, the optoelectronic semiconductor component emits substantially a large portion of the first electromagnetic radiation, and wherein the first electromagnetic radiation is emitted in direction of the first carrier.

The above-described properties, features and advantages and the way in which they are achieved will become clearer and more clearly understood in association with the following description of examples that are explained in greater detail in association with the drawings.

Figure 1:
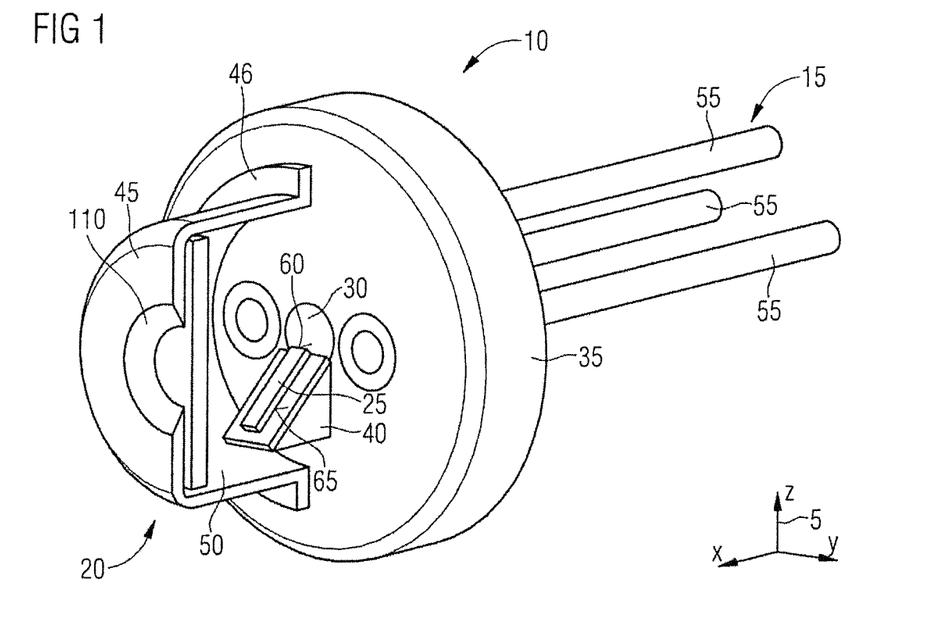
FIG. 1 shows a perspective view of an arrangement in accordance with a first example.

FIG. 1 shows a perspective view of an arrangement 10 comprising a region partly cut away for the sake of improved illustration. To facilitate understanding, reference is made hereinafter to a coordinate system 5. The coordinate system 5 is configured, for example, as a right-handed system and comprises an x-axis (longitudinal direction), a y-axis (transverse direction) and a z-axis (vertical direction).

The arrangement 10 comprises an electrical terminal 15, a housing 20, an optoelectronic semiconductor component 25 and a conversion element 30.

The housing 20 comprises a first carrier 35 and a second carrier 40. The first carrier 35 is configured, for example, in a plate-shaped fashion and comprises, for example, a substantially circular cross section. The electrical terminal 15 is arranged on a first side of the first carrier 35. The second carrier 40, the optoelectronic semiconductor component 25 and the conversion element 30 are arranged on a second side of the first carrier 35, the second side being situated opposite with respect to the electrical terminal 15. The electrical terminal 15 may also be arranged on a side in common with the optoelectronic semiconductor component 25 and the conversion element 30.

The electrical terminal 15 comprises, for example, a plurality of electrical conductors 55 connectable to a control unit. In this case, the electrical conductors 55 are electrically insulated from one another by the first carrier 35. The electrical conductors 55 are led through the first carrier 35 and electrically connected to the optoelectronic semiconductor component 25. Moreover, a number of electrical conductors 55 may be different than that shown in FIG. 1.

In addition, on the second side of the first carrier 35, the housing 20 may comprise a housing cap 45. The housing cap 45 is configured in a hollow-body-like fashion, preferably in a pot-shaped fashion. At a cap edge 46, the housing cap 45 connects to the first carrier 35. The housing cap 45 and the first carrier 35 delimit, for example, an interior 50 of the housing 20, in which the optoelectronic semiconductor component 25, the second carrier 40 and the conversion element 30 are arranged. At an opposite end of the housing cap 45 with respect to the first carrier 35, the housing cap 45 comprises a coupling-out window 110. The optoelectronic semiconductor component 25 is arranged in a longitudinal direction between the coupling-out window 110 and the first carrier 35. The conversion element 30 is positioned approximately centrally on the first carrier 35, wherein the optoelectronic semiconductor component 25 with the second carrier 45 is arranged in a manner offset with respect to the conversion element 30 in the z-direction.

Figure 2:
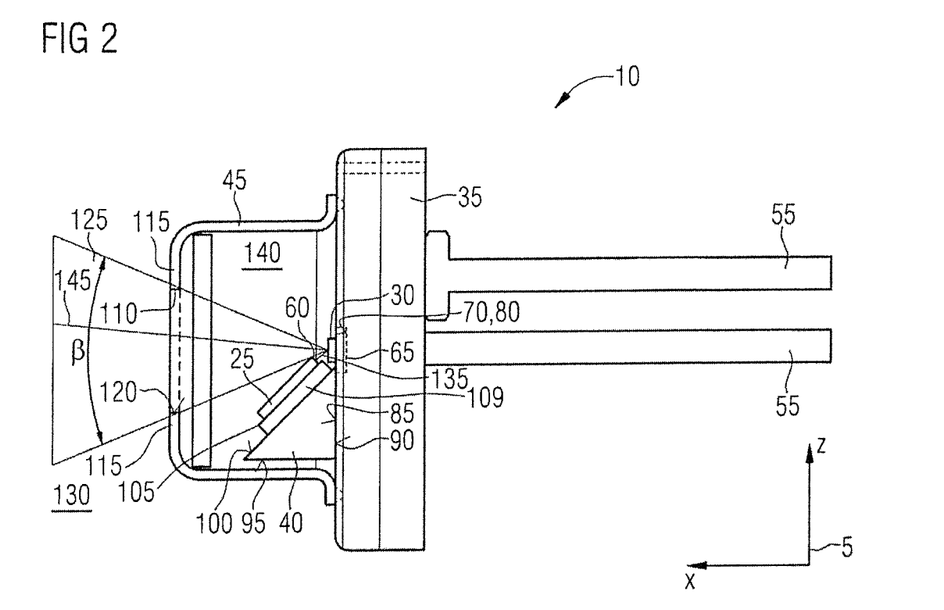
FIG. 2 shows a longitudinal section through the arrangement shown in FIG. 1.

FIG. 2 shows a longitudinal section through the arrangement 10 shown in FIG. 1.

The first carrier 35 preferably comprises a recess 65. The recess 65 is arranged on a second side of the first carrier 35 facing the optoelectronic semiconductor component 25. How-ever, the recess 65 may also be dispensed with in one variant of the arrangement 10. The recess 65 preferably comprises a circular cross section. The recess 65 may also comprise a rectangular, polygonal or other type of cross section. The recess 65 is delimited by a base 70 and a recess side face 75. The recess side face 75 defines the cross section of the recess 65. The base 70 of the recess 65 is preferably arranged parallel to a first carrier top side 85 of the first carrier 35, the first carrier top side facing the optoelectronic semiconductor component 25. The base 70 may be arranged at an inclination with respect to the first carrier top side 85 of the first carrier 35.

The first carrier 35 comprises a carrier plane 80. The carrier plane 80 and the base 70 coincide, for example, in FIGS. 1 and 2. The carrier plane 80 may also be arranged in a manner offset with respect to the base 70. In particular, it is possible here for the carrier plane 80 and the first carrier top side 85 of the first carrier 35 to coincide and be identical.

Preferably, the conversion element 30 is arranged in the recess 65. The conversion element 30 preferably comprises phosphor as conversion material. The optoelectronic semiconductor component 25 may preferably comprise a laser chip or an LED chip.

The second carrier 40 is preferably configured in a triangular fashion in longitudinal section. The second carrier 40 comprises a carrier underside 90, a carrier side face 95 and a second carrier top side 100. The second carrier 40 connects by the carrier underside 90 to the first carrier top side 85. The second carrier top side 100 is at an inclination with respect to the first carrier top side 85 and the carrier underside 90. In this case, the second carrier top side 100 of the second carrier 40 adjoins the carrier underside 90 on a side facing the conversion element 30. The carrier side face 95 of the second carrier 40 is arranged on a side facing away from the conversion element 30. In this case, the carrier side face 95 is oriented, for example, at right angles with respect to the carrier underside 90.

The optoelectronic semiconductor component 25 comprises an emission face 60 and a longitudinal side 105. The optoelectronic semiconductor component 25 is arranged by the longitudinal side 105 on the second carrier top side 100. Preferably, the optoelectronic semiconductor component 25 is configured as an edge emitting optoelectronic semiconductor component 25. Preferably, the emission face 60 is a side face of the optoelectronic semiconductor component 25 preferably adjoining the longitudinal side 105. The emission face 60 faces the conversion element 30. The longitudinal side 105 preferably comprises a larger area than the emission face 60. As a result of the inclined orientation of the second carrier top side 100 with respect to the first carrier top side 85, the optoelectronic semiconductor component 25 is also arranged at an inclination with respect to the carrier plane 80.

In addition, a further carrier 109 may be provided between the second carrier top side 100 and the longitudinal side 105 of the optoelectronic semiconductor component 25, wherein the further carrier 109 mechanically and/or electrically connects the optoelectronic semiconductor component 25 to the second carrier 40.

The housing cap 45 is configured in a pot-shaped fashion and comprises a coupling-out window 110. The coupling-out window 110 is arranged, for example, in a section 115 of the housing cap 45 which preferably runs parallel to the first carrier 35. The coupling-out window 110 comprises a coupling-out window contour 120.

During operation, the optoelectronic semiconductor component 25 provides a first electromagnetic radiation 135 comprising a first wavelength from a first spectral range. In this case, the first spectral range lies in a range between UV light and infrared light. Furthermore, the optoelectronic semiconductor component 25 emits the first electromagnetic radiation 135 substantially with a first beam direction. Furthermore, the optoelectronic semiconductor component 25 emits the first electromagnetic radiation 135, for example, parallel to the second carrier top side 100. As a result, the orientation of the first electromagnetic radiation 135 may be adapted in a simple manner by a corresponding structural adaptation of the second carrier 40. The first electromagnetic radiation 135 is directed onto the conversion element 30. Via the emission face 60, the optoelectronic semiconductor component 25 emits substantially a large portion of the first electromagnetic radiation 135.

During operation of the arrangement 10, the first electromagnetic radiation 135 at least partly impinges on the conversion element 30. The conversion element 30 converts at least part of the first electromagnetic radiation 135 into a second electromagnetic radiation 145 comprising a second wavelength from a second spectral range. The second spectral range is preferably different than the first spectral range and preferably lies in the range of visible light.

The coupling-out window 110 is at least partly transmissive at least to the second electromagnetic radiation 145. The coupling-out window 120 delimits an emission direction of the second electromagnetic radiation 145 to an effective emission region 125, with which direction the second electromagnetic radiation 145 is emitted into surroundings 130 of the arrangement 10. On the rear side, on account of the material of the first carrier 35 that is non-transmissive to the second electromagnetic radiation 145, the emission direction of the second electromagnetic radiation 145 is restricted to a direction facing away from the carrier plane 80.

The effective emission region 125 is configured in a conical fashion in sections, for example, in the interior 50 and comprises an aperture angle β, wherein the aperture angle β is determined by a distance between the coupling-out window 110 and the conversion element 30 and depending on the geometrical configuration of the coupling-out window contour 120.

Figure 3:
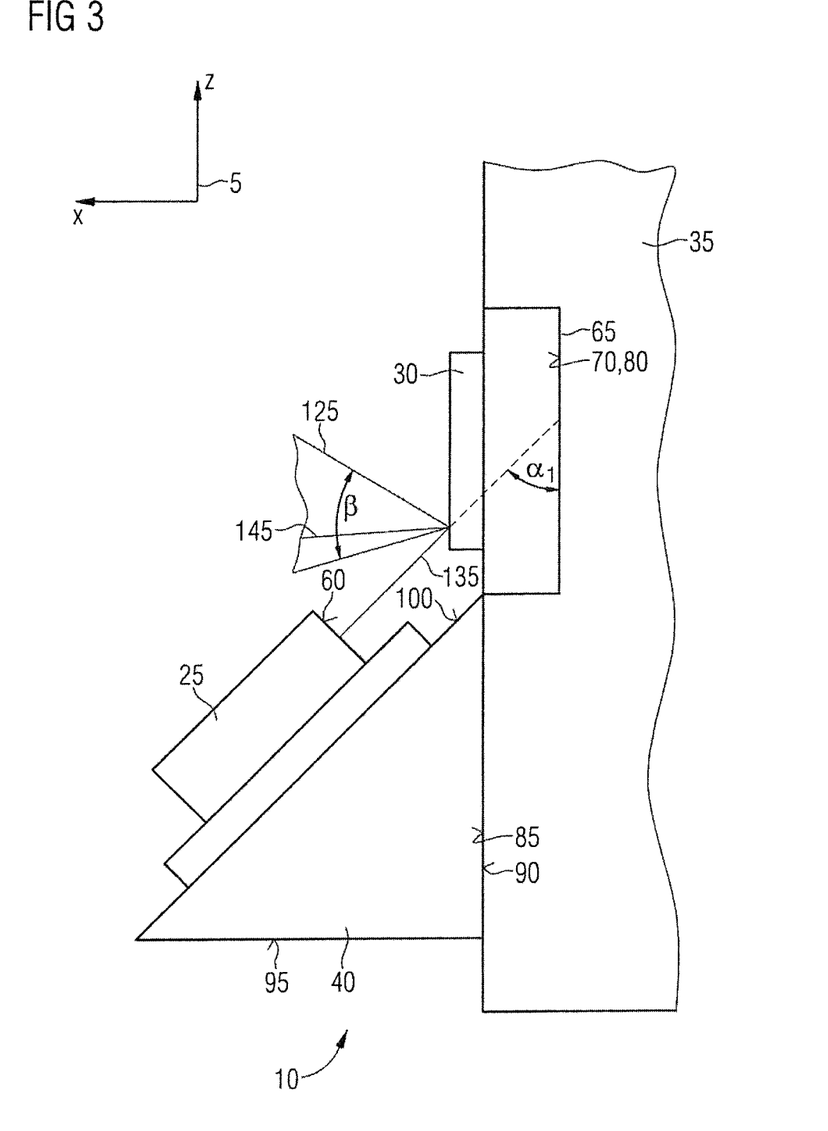
FIG. 3 shows an excerpt from the arrangement shown in FIG. 2.

FIG. 3 shows an excerpt from the arrangement 10 shown in FIG. 2. It is particularly advantageous if the first electromagnetic radiation 135 and the carrier plane 80 form a first angle $\alpha_1$, wherein the first angle $\alpha_1$ comprises a value that lies in a range of 15° to 75°, preferably 30° to 60°, particularly advantageously 40° to 50°. It is particularly advantageous if the value is 45°.

In this case, the second carrier top side 100 and the optoelectronic semiconductor component 25 on the second carrier top side 100 are arranged such that the optoelectronic semiconductor component 25 and the second carrier 40 are arranged outside the effective emission region 125 and thus in a region 140 in which the second electromagnetic radiation 145 is not coupled out from the interior 50.

The arrangement 10 has the advantage that heat that arises during operation of the arrangement 10 may be dissipated particularly well from the optoelectronic semiconductor component 25 via the second carrier 40 into the first carrier 35.

Furthermore, as a result of the direct arrangement of the conversion element 30 on the first carrier 35, a heat path that cools the conversion element 30 is particularly short such that heat in the conversion element 30 arising in the course of the conversion of the first electromagnetic radiation 135 to the second electromagnetic radiation 145 during operation may be dissipated particularly well. Overheating of the conversion element 30 may be avoided as a result. On account of the large surface area of the first carrier 35, the latter may emit the heat that arises during the operation of the optoelectronic semiconductor component 25 to the surroundings 130 particularly well.

Furthermore, the power of the first electromagnetic radiation 135 radiated into the conversion element 30 may be particularly high as a result of the improved cooling of the conversion element 30, without the conversion element 30 being thermally damaged.

Furthermore, the arrangement 10 comprises the advantage that, particularly if the optoelectronic semiconductor component 25 comprises a laser chip, the first electromagnetic radiation 135 is not directly coupled out via the coupling-out window 110, with the result that the arrangement 10 is particularly safe with regard to laser safety.

Figure 4:
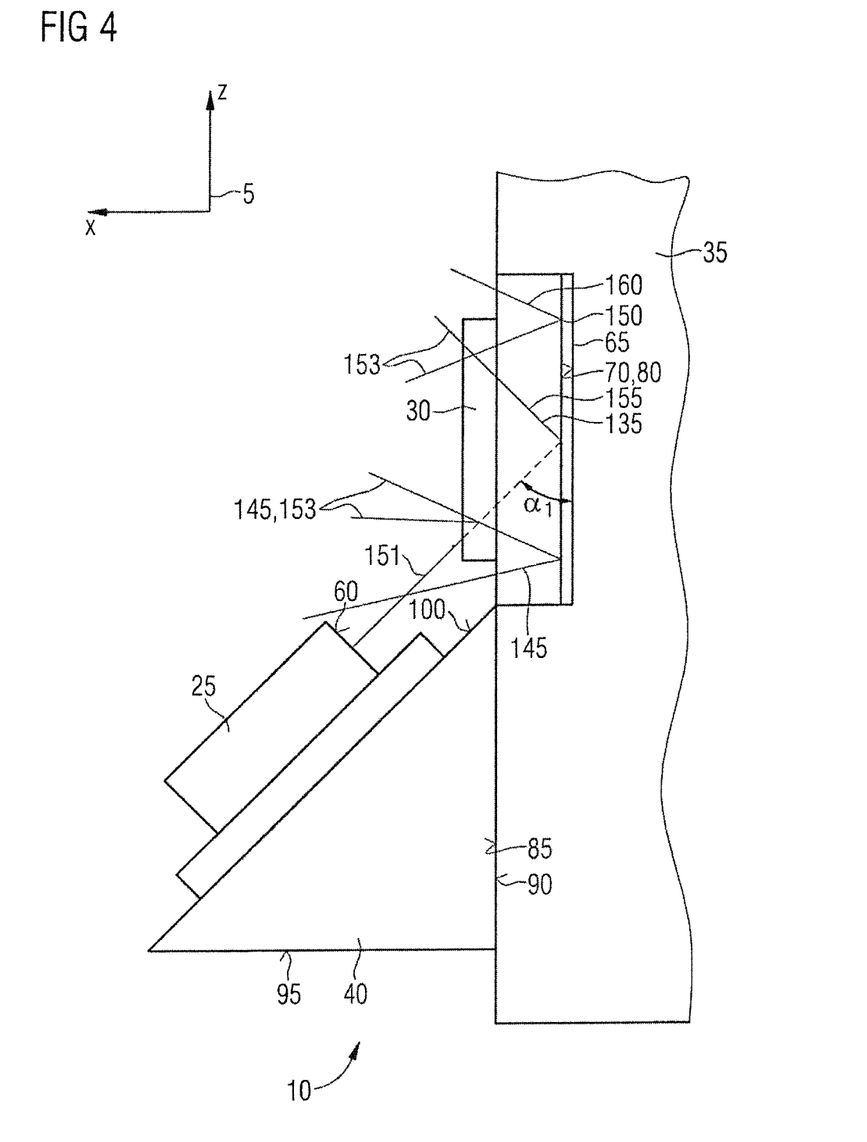
FIG. 4 shows an excerpt from an arrangement in accordance with a second example.

FIG. 4 shows an excerpt from a longitudinal section through an arrangement 10 in accordance with a second example. The arrangement 10 is configured similarly to the arrangement 10 shown in FIGS. 1 to 3. In a departure therefrom, the arrangement 10 comprises a reflection layer 150. The reflection layer 150 is arranged between the carrier plane 80 and the conversion element 30. In FIG. 4, the reflection layer 150 is preferably arranged on the base 70 in the recess 65 and extends completely over the base 70.

During operation of the optoelectronic semiconductor component 25, the optoelectronic semiconductor component 25 emits the first electromagnetic radiation 135 via the emission face 60. The first electromagnetic radiation 135 impinges on the conversion element 30. The conversion element 30 converts a first part 151 into the second electromagnetic radiation 145. The second electromagnetic radiation 145 is in this case non-directional, for example. In this regard, a first portion 152 of the second electromagnetic radiation 145 is emitted in the direction of the coupling-out window 110 of the housing cap 45, whereas by contrast a second portion 153 of the second electromagnetic radiation 145 radiates in the direction of the first carrier 40 in the conversion element 30. The second portion 153 of the second electromagnetic radiation 145 is reflected by the reflection layer 150 in a direction facing away from the first carrier 35. Depending on the reflection direction, the second portion 153 of the second electromagnetic radiation may emerge through the coupling-out window 110 into the surroundings 130 or is shaded by the housing cap 45. The efficiency of the arrangement 10 may be additionally increased by the reflection layer 150.

What is particularly advantageous as a result of the provision of the reflection layer 150 is that a beam path of the first electromagnetic radiation 135 through the conversion element 30 is lengthened compared to the configuration shown in FIGS. 1 to 3. As a result, a second part 155 of the first electromagnetic radiation 135, the second part not being converted into the second electromagnetic radiation 145 on the path between the optoelectronic semiconductor component 25 and the reflection layer 150, may be reflected by the reflection layer 150, wherein the second part 155 of the first electromagnetic radiation 135 once again passes through the conversion element 30. In the course of passing through the latter once again, the second part 155 of the first electromagnetic radiation 135 may then be at least partly converted into the second electromagnetic radiation 145. As a result, the arrangement 10 comprises a particularly high efficiency.

Figure 5:
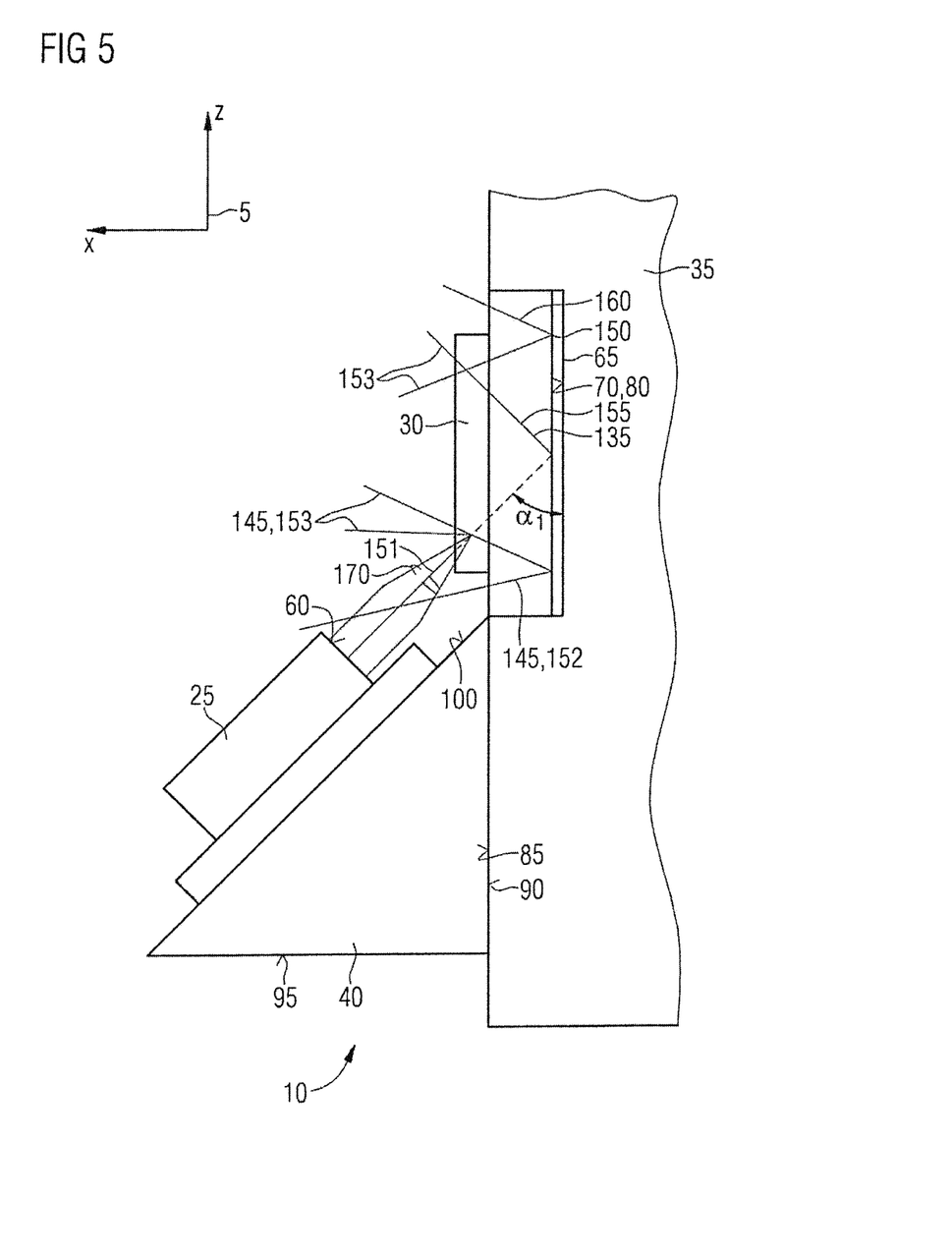
FIG. 5 shows an excerpt from an arrangement in accordance with a third example.

FIG. 5 shows an excerpt from an arrangement 10 in accordance with a third example. The arrangement 10 is configured substantially identically to the example of the arrangement 10 as shown in FIG. 4. In a departure therefrom, in addition to the configuration shown in FIG. 4, a first optical element 170 is arranged between the emission face 60 of the optoelectronic semiconductor component 25 and the conversion element 30. The first optical element 170 may be configured, for example, as a lens or as a lens arrangement. The first optical element 170 focuses the first electromagnetic radiation onto the conversion element 30 to thus feed a particularly high yield of first electromagnetic radiation 135 to the conversion element 30. As a result, the efficiency of the arrangement 10 is increased compared to the arrangements 10 shown in FIGS. 1 to 4.

Figure 6:
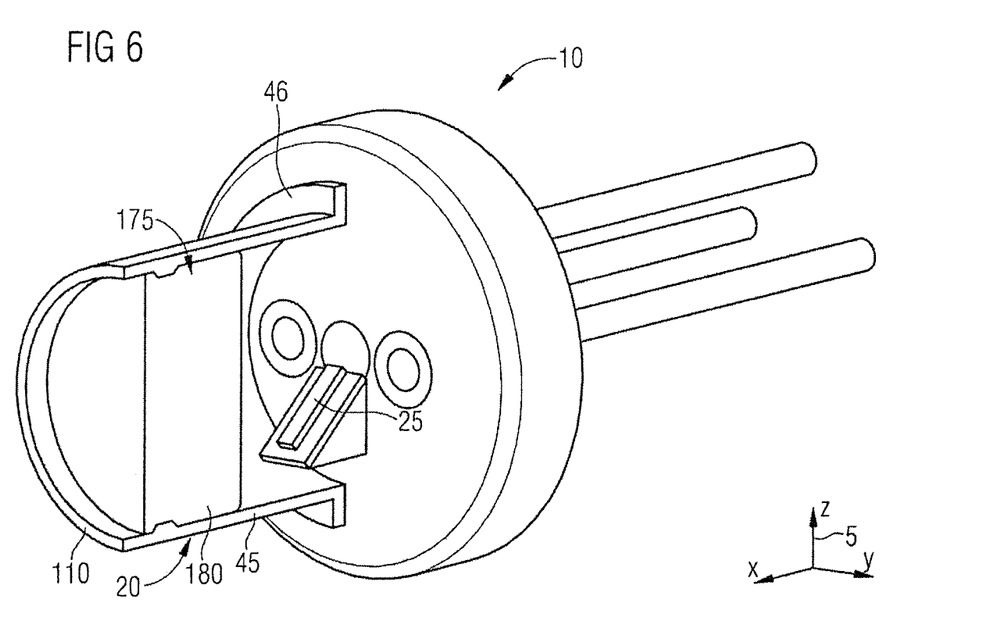
FIG. 6 shows a perspective view of an arrangement in accordance with a fourth example.

FIG. 6 shows a perspective view with a partly cut-away region of an arrangement 10 in accordance with a fourth example.

The arrangement 10 is configured similarly to the arrangement 10 shown in FIGS. 1 to 5. In a departure therefrom, compared to FIG. 5, for example, the first optical element 170 is dispensed with. The first optical element 170 may likewise be provided in the fourth example. Furthermore, the coupling-out window 110 comprises an enlarged configuration in the transverse direction and vertical direction by comparison with the configuration shown in FIGS. 1 and 2. As a result, the housing cap 45 is configured substantially in a hollow-cylindrical fashion. A second optical element 175 is provided in the longitudinal direction between the coupling-out window 110 and the optoelectronic semiconductor component 25. The second optical element 175 may be a lens 180 and/or a lens arrangement, consisting of a plurality of lenses 180. The second optical element 175 is configured to alter a beam behavior of the second electromagnetic radiation. In this case, the second optical element 175 may delimit a spatial extent of the emission region 125. The second optical element 175 alter the second electromagnetic radiation 145 to the effect that individual beams 185 of the second electromagnetic radiation 145 run substantially parallel. The second optical element 175 may also focus or expand the second electromagnetic radiation 145.

Figure 7:
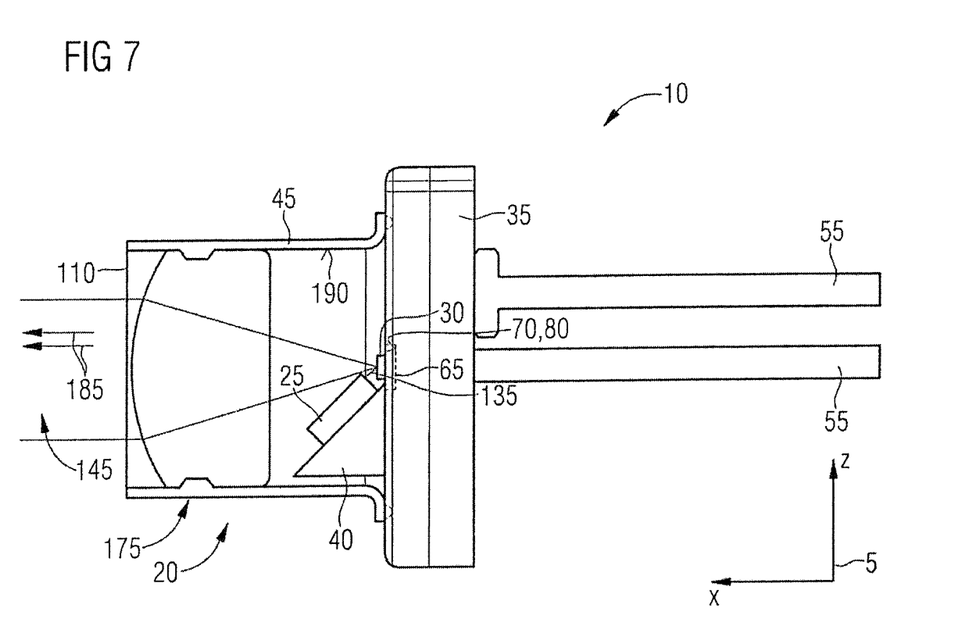
FIG. 7 shows a longitudinal section through the arrangement shown in FIG. 6.

FIG. 7 shows a longitudinal section through the arrangement 10 shown in FIG. 6.

The second optical element 175 connects to an interior face 190 in a positively locking manner, for example. In this case, the second optical element 175 is arranged between the coupling-out window 110 and the conversion element 30. The optoelectronic semiconductor component 25 is arranged in a longitudinal direction between the second optical element 175 and the conversion element 30.

Figure 8:
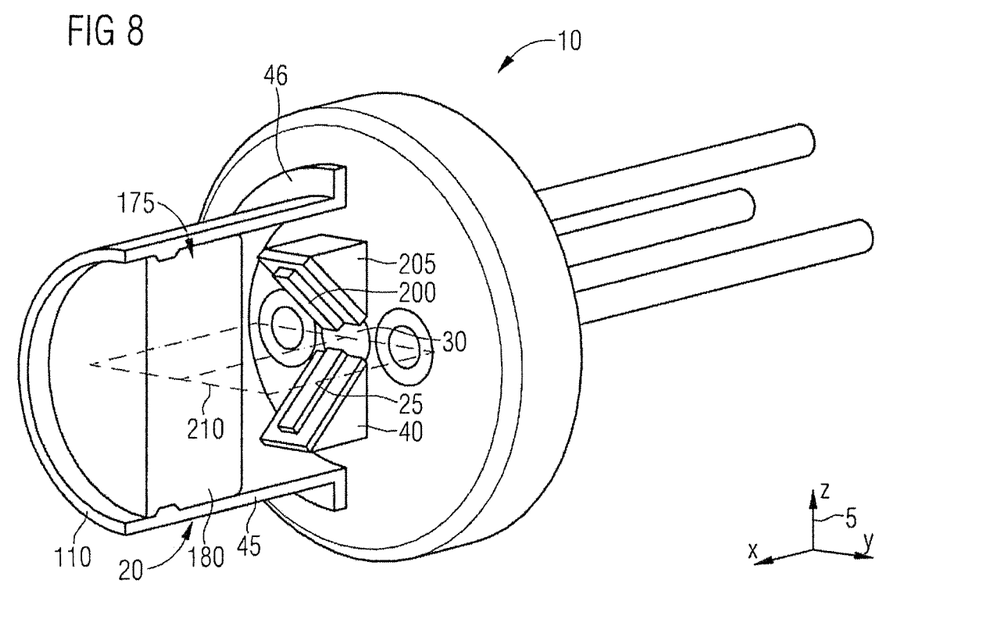
FIG. 8 shows a perspective view of an arrangement in accordance with a fifth example.

FIG. 8 shows a perspective view with a partly cut-away region of an arrangement 10 in accordance with a fifth example. The arrangement 10 is configured similarly to the arrangement 10 shown in FIGS. 6 and 7. In a departure therefrom, the arrangement 10 comprises a further optoelectronic semiconductor component 200 and a third carrier 205. The further optoelectronic semiconductor component 200 electrically connects in parallel with the optoelectronic semiconductor component 25. Moreover, the further optoelectronic semiconductor component 200 and the optoelectronic semiconductor component 25 may electrically interconnect in series.

The further optoelectronic semiconductor component 200 and the third carrier 205 are arranged mirror-symmetrically with respect to a plane of symmetry 210 configured as an xy-plane. The plane of symmetry 210 is preferably arranged centrally relative to the conversion element 30.

It would also be possible for the further optoelectronic semiconductor component 200 and the third carrier 205 to be arranged with respect to the optoelectronic semiconductor component 25 and the second carrier 40 rotationally symmetrically with respect to a center axis 215 (extending in the x-direction) of the arrangement 10. In this case, the center axis 215 is preferably arranged centrally relative to the conversion element 30.

Figure 9:
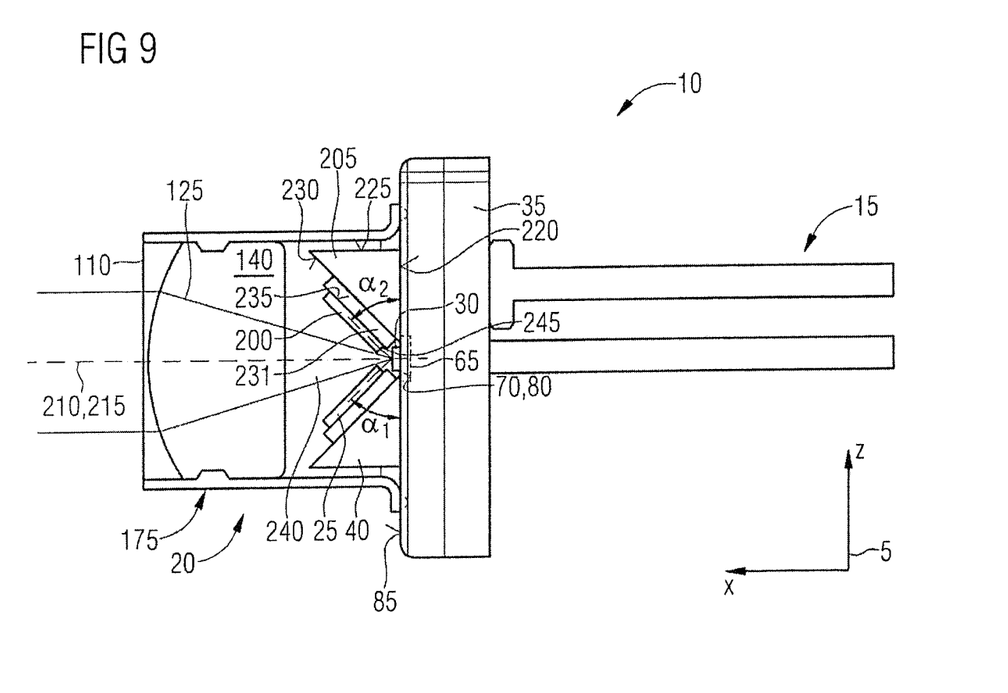
FIG. 9 shows a longitudinal section through the arrangement shown in FIG. 8.
Figure 10:
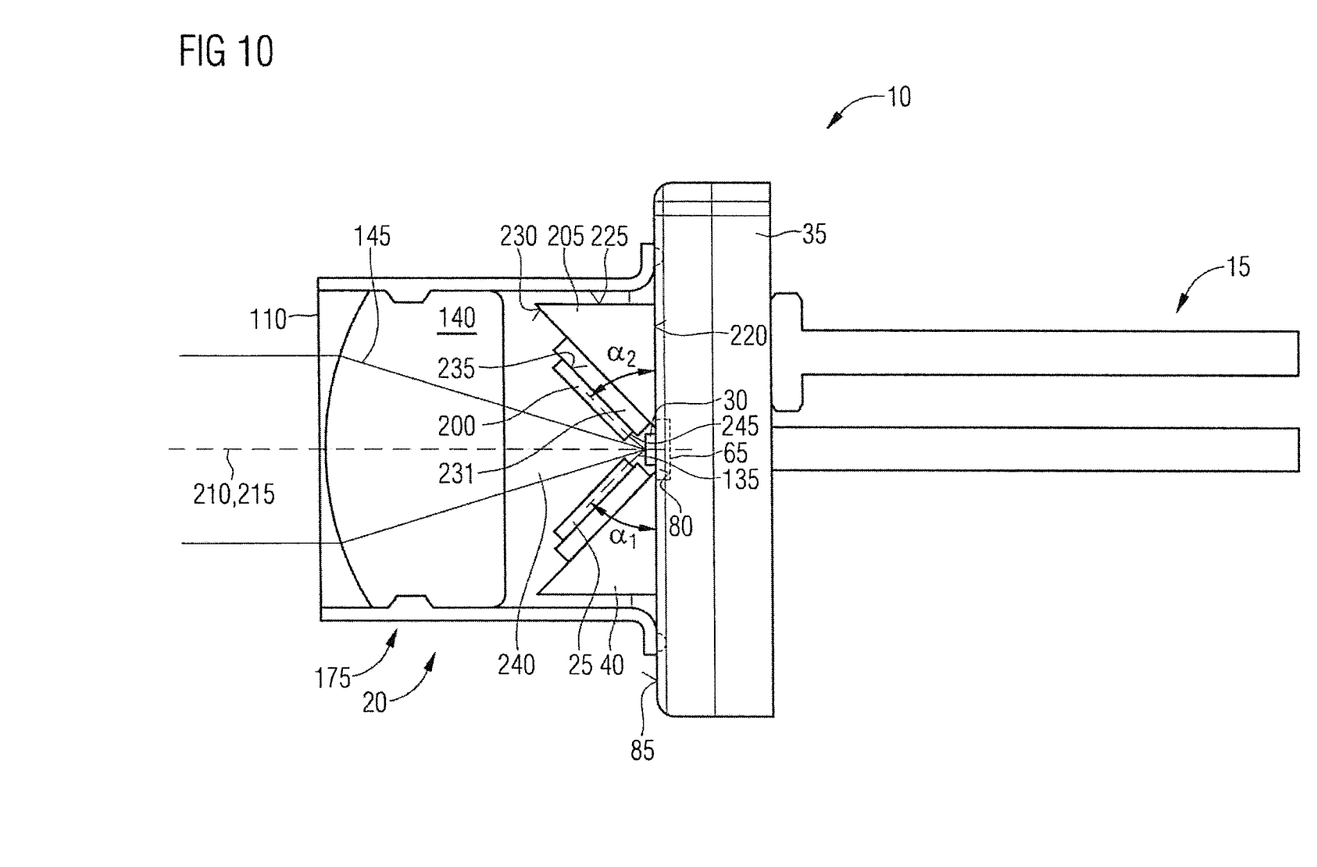
FIG. 10 shows an excerpt from the longitudinal section shown in FIG. 9.

FIG. 9 shows a longitudinal section through the arrangement 10 shown in FIG. 8. FIG. 10 shows an excerpt from the longitudinal section shown in FIG. 9.

The third carrier 205 comprises a further carrier underside 220, a further carrier side face 225 and a third carrier top side 230. The third carrier top side 230 is arranged at an inclination with respect to the carrier plane 80. The further optoelectronic semiconductor component 200 is arranged on the third carrier top side 230. The third carrier 205 is arranged by the further carrier underside 220 on the first carrier top side 85 of the first carrier 35. The further side face 225 is arranged on a side of the third carrier 205 facing away from the conversion element 30 and from the second carrier 40. Furthermore, an additional further carrier 231 may additionally be provided between the third carrier top side 230 and the further optoelectronic semiconductor component 200.

The further optoelectronic 200 is arranged by a further longitudinal side 235 on the third carrier top side 230. The further optoelectronic semiconductor component 200 is configured as an edge emitting optoelectronic semiconductor component and preferably comprises a laser chip or an LED chip. The further optoelectronic semiconductor component 200 comprises a further emission face 245 preferably adjoining the further longitudinal side 232 and arranged on a side of the further optoelectronic semiconductor component 200 facing the conversion element 30. The further optoelectronic semiconductor component 200 may advantageously be configured identically to the optoelectronic semiconductor component 25.

The conversion element 30 is arranged in the z-direction between the second carrier 40 and the third carrier 205.

The further optoelectronic semiconductor component 200 is configured to provide a third electromagnetic radiation 240 comprising a third wavelength from a third spectral range and a third beam direction during operation. The further optoelectronic semiconductor component 200 emits the third electromagnetic radiation 240 largely via the further emission face 245. The third beam direction of the third electromagnetic radiation 240 is preferably oriented substantially parallel to the third carrier top side 230 of the third carrier 205. In this case, the third beam direction of the third electromagnetic radiation 240 is arranged at an inclination with respect to the carrier plane 80. The third electromagnetic radiation 240 is directed onto the conversion element 30.

Preferably, the third beam direction of the third electromagnetic radiation 240 comprises a second angle $\alpha_2$, wherein the second angle $\alpha_2$ is preferably identical to the first angle $\alpha_1$. Alternatively, it is also possible for the first angle $\alpha_1$ to be different than the third angle $\alpha_2$. It is particularly advantageous here if the second angle $\alpha_2$ comprises a value of 15° to 75°, in particular 40° to 60°, particularly advantageously 40° to 50°. It is furthermore particularly advantageous if the second angle $\alpha_2$ is substantially 45°. The conversion element 30 is configured at least partly to convert the first and third electromagnetic radiation 135, 240 into the second electromagnetic radiation 145 comprising the second wavelength.

The conversion element 30 emits the second electromagnetic radiation 145. In this case, the emission direction, as already explained in FIGS. 1 to 7, is delimited by the coupling-out window 110 and/or by the second optical element 175. In this case, the further optoelectronic semiconductor component 200 and the third carrier 205 are arranged in a shaded region 140 such that the emission region 125 is arranged between the optoelectronic semiconductor component 25 and the further optoelectronic semiconductor component 200.

The reflection layer 150 explained in FIG. 4 may optionally be provided. In this case, the reflection layer 150 combines the second electromagnetic radiation 145 converted from the first electromagnetic radiation 135 and the third electromagnetic radiation 240. Furthermore, the reflection layer 150 brings about the advantages (explained in FIG. 4) of the longer transmission path through the conversion element 30 for the third electromagnetic radiation 240 as well, such that a high proportion of the third electromagnetic radiation 240 may be converted into the second electromagnetic radiation 145 by the conversion element 30.

The example of the arrangement 10 as shown in FIGS. 8 and 9 comprises an increased power density compared to the arrangements 10 shown in FIGS. 1 to 7.

The example shown in FIGS. 8 and 9 may be developed to the effect that at least one additional further carrier and one additional further optoelectronic semiconductor component are provided, wherein the further optoelectronic semiconductor component 25 provides electromagnetic radiation directed onto the conversion element 30. What is advantageous in this case is that, first, a plurality of optoelectronic semiconductor components 25 may be accommodated in a common housing 20 of the arrangement 10 and at the same time provision is made of only one conversion element 30 that converts the electromagnetic radiation 135, 240 of the optoelectronic semiconductor components 25, 200. As a result, the power density of the arrangement 10 may be increased particularly cost-effectively.

In FIGS. 8 and 9, the arrangement 10 comprises the second optical element 175 explained in FIGS. 6 and 7. The second optical element 175 may also be dispensed with and the second electromagnetic radiation 145 may be coupled out from the arrangement 10 into the surroundings 130 directly via the coupling-out window 110.

Furthermore, the features shown in FIGS. 1 to 7 individually or in combination are combinable with the example of the arrangement 10 as shown in FIGS. 8 and 9.

In a further variation of the arrangement 10 shown in FIGS. 1 to 9, the first carrier 35 and the second carrier 40 (and, if appropriate, the third carrier 205) may be configured integrally and material-uniformly. Alternatively, the second carrier 40 and the third carrier 205 may be configured integrally and material-uniformly. In this configuration, the side face 95, 225 of the second carrier 40 and of the third carrier 205 may be configured in a continuous fashion.

Furthermore, the features of the various arrangements 10 shown in FIGS. 1 to 9 may also be configured differently and the features of the arrangements 10 shown in FIGS. 1 to 9 may also be combined with one another, differently than shown in FIGS. 1 to 9, individually or jointly. Moreover, individual features of the arrangements 10 shown in FIGS. 1 to 9 may be omitted or further features, not illustrated, may be provided.

Although our optoelectronic arrangements have been more specifically illustrated and described in detail by the preferred examples, nevertheless this disclosure is not restricted by the examples disclosed and other variations may be derived therefrom by those skilled in the art, without departing from the scope of protection of the appended claims.

This application claims priority of DE 10 2015 117 539.8, the subject matter of which is incorporated herein by reference.

The invention claimed is:

1. An arrangement comprising:
a conversion element, an optoelectronic semiconductor component and a first carrier comprising a carrier plane,
wherein the conversion element is arranged on the carrier plane,
the optoelectronic semiconductor component emits a first electromagnetic radiation comprising a first beam direction and a first wavelength from a first spectral range during operation,
the first electromagnetic radiation is directed onto the conversion element,
the conversion element at least partly converts the first electromagnetic radiation into a second electromagnetic radiation comprising a second wavelength from a second spectral range,
the first beam direction of the optoelectronic semiconductor component is oriented at an inclination with respect to the carrier plane,
a housing comprising a housing cap is provided,
the housing cap is configured in a hollow-body-like fashion,
the housing cap and the carrier delimit an interior,
the conversion element and the semiconductor component are arranged in the interior,
the housing cap comprises a coupling-out window that couples out the second electromagnetic radiation,
the first carrier comprises a first carrier top side,
a second carrier comprising a second carrier top side and a carrier underside is provided,
the second carrier connects by the carrier underside to the first carrier top side,
the optoelectronic semiconductor component is arranged on the second carrier top side,
the second carrier top side is arranged at an inclination with respect to the carrier plane,
the optoelectronic semiconductor component comprises an emission face and a longitudinal side,
the optoelectronic semiconductor component is arranged by the longitudinal side on the second carrier top side,
the emission face is a side face of the optoelectronic semiconductor component adjoining the longitudinal side,
the emission face faces the conversion element,
via the emission face, the optoelectronic semiconductor component emits substantially a large portion of the first electromagnetic radiation, and
the first electromagnetic radiation is emitted in direction of the first carrier.

2. The arrangement according to claim 1, wherein
the conversion element emits the second electromagnetic radiation with an emission direction,
the emission direction of the second electromagnetic radiation is delimited to an effective emission region by a means arranged in a manner offset with respect to the conversion element, and
the optoelectronic semiconductor component is arranged outside the effective emission region.

3. The arrangement according to claim 1, wherein
a reflection layer is provided,
the reflection layer is arranged between the first carrier and the conversion element, and
the reflection layer reflects the first and/or second electromagnetic radiation at least in a direction facing away from the first carrier.

4. The arrangement according to claim 1, wherein
the first carrier comprises a recess on a side facing the optoelectronic semiconductor component,
the carrier plane is arranged at a base of the recess, and
the conversion element is at least partly arranged in the recess and the optoelectronic component is arranged outside the recess.

5. The arrangement according to claim 4, wherein
the recess comprises a base and a recess side face,
the recess is delimited by the base and the recess side face, and
the recess side face adjoins the second carrier top side.

6. The arrangement according to claim 1, wherein
the first beam direction and the carrier plane form an angle,
the angle comprises a value of 40° to 50°.

7. The arrangement according to claim 1, wherein
the optoelectronic semiconductor component comprises an emission face and a longitudinal side,
the optoelectronic semiconductor component is arranged by the longitudinal side on the second carrier top side and the emission face is a side face of the optoelectronic semiconductor component which adjoins the longitudinal side,
the emission face is shorter than the longitudinal side,
the optoelectronic semiconductor component emits a large portion of the first electromagnetic radiation via the emission face facing the conversion element.

8. The arrangement according to claim 1, wherein
a first optical element is arranged between the optoelectronic semiconductor component and the conversion element, and
the first optical element focuses the first electromagnetic radiation onto the conversion element.

9. The arrangement according to claim 1, wherein
the housing cap comprises a cap edge,
the cap edge connects to the first carrier, and
the coupling-out window is arranged in a manner offset with respect to the cap edge.

10. The arrangement according to claim 1, wherein the optoelectronic semiconductor component is arranged between the coupling-out window and the first carrier.

11. The arrangement according to claim 1, further comprising:
a second optical element,
wherein the second optical element connects to the housing cap,
the second optical element alters a beam behavior of the second electromagnetic radiation, and
the second optical element preferably comprises at least one lens.

12. The arrangement according to claim 11, wherein
the second optical element is arranged between the coupling-out window and the conversion element, and
the optoelectronic semiconductor component is arranged between the conversion element and the second optical element.

13. The arrangement according to claim 1, further comprising:
a further optoelectronic semiconductor component,
wherein the further optoelectronic semiconductor component provides a third electromagnetic radiation comprising a third wavelength and a third beam direction during operation,
the third electromagnetic radiation is directed onto the conversion element, the conversion element at least partly converts the first and third electromagnetic radiation into the second electromagnetic radiation, and the third beam direction is at an inclination with respect to the carrier plane.

14. The arrangement according to claim 13, wherein the emission direction of the second electromagnetic radiation is guided between the optoelectronic semiconductor component and the further optoelectronic semiconductor component.

15. The arrangement according to claim 1, wherein the optoelectronic semiconductor component comprises at least one laser chip, at least one LED chip or a combination thereof.

16. The arrangement according to claim 1, wherein a cap edge of the housing cap directly contacts the first carrier and connects to the first carrier.

17. The arrangement according to claim 1, wherein the first electromagnetic radiation is not directly coupled out via the coupling-out window.

18. The arrangement according to claim 17, wherein
the conversion element emits the second electromagnetic radiation with an emission direction,
the emission direction of the second electromagnetic radiation is delimited to an effective emission region by a means arranged in a manner offset with respect to the conversion element, and
the optoelectronic semiconductor component is arranged outside the effective emission region,
a reflection layer is provided,
the reflection layer is arranged between the first carrier and the conversion element, and
the reflection layer reflects the first and/or second electromagnetic radiation at least in a direction facing away from the first carrier.

19. An arrangement comprising:
a conversion element, an optoelectronic semiconductor component and a first carrier comprising a carrier plane,
wherein the conversion element is arranged on the carrier plane,
the optoelectronic semiconductor component emits a first electromagnetic radiation comprising a first beam direction and a first wavelength from a first spectral range during operation,
the first electromagnetic radiation is directed onto the conversion element,
the conversion element at least partly converts the first electromagnetic radiation into a second electromagnetic radiation comprising a second wavelength from a second spectral range,
the first beam direction of the optoelectronic semiconductor component is oriented at an inclination with respect to the carrier plane,
the first carrier comprises a first carrier top side,
a second carrier comprising a second carrier top side and a carrier underside is provided,
the second carrier connects by the carrier underside to the first carrier top side,
the optoelectronic semiconductor component is arranged on the second carrier top side,
the second carrier top side is arranged at an inclination with respect to the carrier plane,
the optoelectronic semiconductor component comprises an emission face and a longitudinal side,
the optoelectronic semiconductor component is arranged by the longitudinal side on the second carrier top side,
the emission face is a side face of the optoelectronic semiconductor component adjoining the longitudinal side,
the emission face faces the conversion element,
via the emission face, the optoelectronic semiconductor component emits substantially a large portion of the first electromagnetic radiation, and
the first electromagnetic radiation is emitted in direction of the first carrier.

20. An arrangement comprising:
a conversion element, an optoelectronic semiconductor component and a first carrier comprising a carrier plane,
wherein the conversion element is arranged on the carrier plane,
the optoelectronic semiconductor component emits a first electromagnetic radiation comprising a first beam direction and a first wavelength from a first spectral range during operation,
the first electromagnetic radiation is directed onto the conversion element,
the conversion element at least partly converts the first electromagnetic radiation into a second electromagnetic radiation comprising a second wavelength from a second spectral range,
the first beam direction of the optoelectronic semiconductor component is oriented at an inclination with respect to the carrier plane,
a housing comprising a housing cap is provided,
the housing cap is configured in a hollow-body-like fashion,
the housing cap and the carrier delimit an interior,
the conversion element and the semiconductor component are arranged in the interior,
the housing cap comprises a coupling-out window that couples out the second electromagnetic radiation, wherein the conversion element comprises a first long side, a second long side and a side face, which connects the first long side with the second long side,
wherein the side face is shorter than the first longitudinal side,
wherein the second longitudinal side and is arranged on a side facing the coupling-out window,
wherein the conversion element is arranged with the first longitudinal side on the carrier plane,
wherein the first electromagnetic radiation enters the conversion element via the second longitudinal side and the second electromagnet leaves the conversion element via the second longitudinal side towards the coupling-out window.

\* \* \* \* \*